United States Patent
Wang et al.

(10) Patent No.: US 8,031,008 B2
(45) Date of Patent: *Oct. 4, 2011

(54) PLL WITH LOOP BANDWIDTH CALIBRATION CIRCUIT

(75) Inventors: Ping-Ying Wang, Hsinchu (TW); Bing-Yu Hsieh, Taipei (TW); Ling-Wei Ke, Hsinchu Hsien (TW); Tai Yuan Yu, Taoyuan Hsien (TW)

(73) Assignee: Mediatek Inc., Hsin-Chu (TW)

( * ) Notice: Subject to any disclaimer, the term of this patent is extended or adjusted under 35 U.S.C. 154(b) by 43 days.

This patent is subject to a terminal disclaimer.

(21) Appl. No.: 12/426,981

(22) Filed: Apr. 21, 2009

(65) Prior Publication Data

US 2010/0264993 A1    Oct. 21, 2010

(51) Int. Cl.
    *H03L 7/00*    (2006.01)
(52) U.S. Cl. .............. 331/16; 331/1 A; 331/17; 331/25
(58) Field of Classification Search ............ 331/1 A, 331/16, 25

See application file for complete search history.

(56) References Cited

U.S. PATENT DOCUMENTS

2009/0174491 A1 * 7/2009 Wang et al. ............... 331/1 A
2009/0206941 A1 * 8/2009 Wang et al. ............... 332/119

* cited by examiner

*Primary Examiner* — Joseph Chang
*Assistant Examiner* — Jeffrey Shin
(74) *Attorney, Agent, or Firm* — Thomas|Kayden

(57) ABSTRACT

A phase locked loop (PLL) with a loop bandwidth calibration circuit is provided. The mixed-mode PLL comprises an analog phase correction path, a digital frequency correction path, a calibration current source, and a loop bandwidth calibration circuit. The analog phase correction path comprises a linear phase correction unit (LPCU). The digital frequency correction path comprises a digital integral path circuit. The calibration current source is coupled to the LPCU. The loop bandwidth calibration circuit is coupled to a frequency divider and coupled between the input and output of the PLL. The loop bandwidth calibration circuit operates after the calibration current source injects a calibration current into the LPCU.

20 Claims, 5 Drawing Sheets

PLL WITH LOOP BANDWIDTH CALIBRATION CIRCUIT

BACKGROUND OF THE INVENTION

1. Field of the Invention

The invention relates to a phase locked loop (PLL) and, in particular, to a PLL with a calibration circuit.

2. Description of the Related Art

Accurate loop bandwidth calibration of a fractional-N PLL is important for ΔΣ frequency modulators because wider loop bandwidth will increase phase noise and quantization error. A lower loop bandwidth, on the other hand, will suppress modulation messages and increase phase errors.

BRIEF SUMMARY OF THE INVENTION

The present invention proposes a fractional-N PLL, which uses a linear PFD in a proportional path and a bang-bang PFD in an integral path. The PLL has advantages from using not only analog filters to achieve low spur and quantization error but also scalable digital filters.

The proposed PLL architecture obtains accurate loop bandwidth by using a loop bandwidth calibration technique. The loop dynamic was first analyzed and then loop bandwidth circuits were used to measure and verify the analysis. Based on the loop dynamic analysis, it was found that the architecture had both the advantages of a type I and a type II loop filter, such as low jitter peaking and zero static phase error. Thus, the PLL is suitable for low jitter applications as well as frequency modulation.

An embodiment of a phase locked loop (PLL) with a loop bandwidth calibration circuit comprises an analog phase correction path, a digital frequency correction path, a calibration current source, and a loop bandwidth calibration circuit. The analog phase correction path comprises a linear phase correction unit (LPCU). The digital frequency correction path comprises a digital integral path circuit. The calibration current source is coupled to the LPCU. The loop bandwidth calibration circuit is coupled to a frequency divider and coupled between the input and output of the PLL. The loop bandwidth calibration circuit operates after the calibration current source injects a calibration current into the LPCU.

The invention provides a loop bandwidth calibration technique for a DCO-based fractional-N PLL. The PLL has a linear PFD in a proportional path and a bang-bang PFD in an integral path. Calibrations work in a pure digital domain and 1 KHz resolution is achieved by the closed loop operation. Analysis showed that the architecture had both advantages of a type I and a type II loop filter, such as low jitter peaking and zero static phase error thereby, validating the effectiveness of the disclosed technique.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
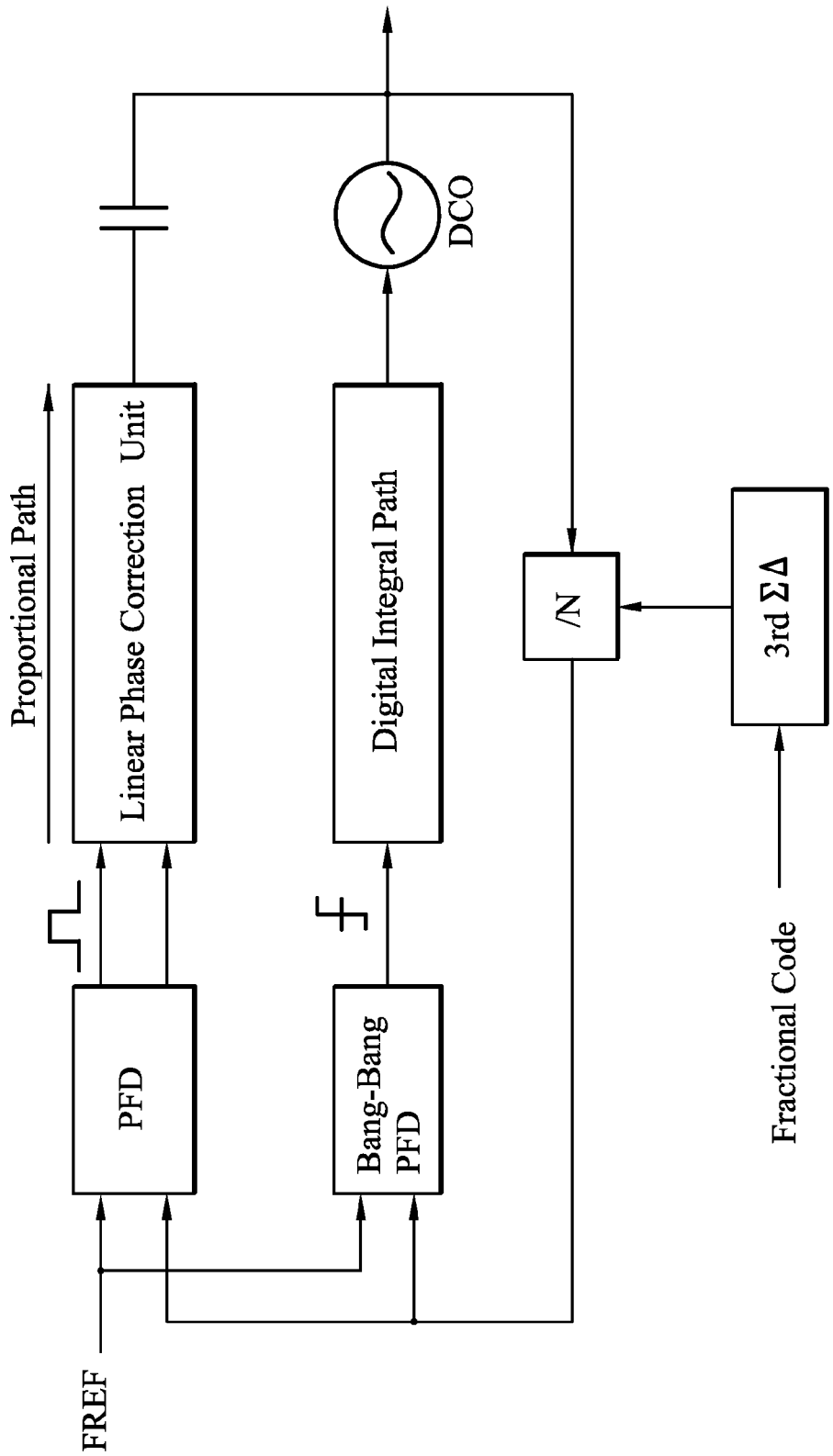
FIG. 1 is a block diagram of a hybrid-type PLL.

The block diagram of the DCO-based fractional-N PLL is shown in FIG. 1. The proportional path consists of a linear phase correction unit (LPCU), which is coupled with a DCO output by AC coupling capacitors. The digital integral path circuits track the frequency of the reference clock in the digital domain by a bang-bang PFD to eliminate the need for a large passive capacitor and a time to digital converter (TDC). In order to calibrate the loop bandwidth, the PLL was analyzed as follows. First, the effective capacitance of the digital filter in the integral path was realized by comparison with the linear model of the conventional digital charge pump PLL, which is:

$$H_{con}(s) = \left(Kp + \frac{Kz}{s \cdot C}\right) \cdot \frac{Kvco}{N \cdot s}. \tag{1}$$

The coefficient of the inverse square s represents the frequency gain, which is defined as frequency correction by the loop divided by the phase error and the divider N. In a conventional charge pump PLL, the coefficient is $$\frac{Ich \cdot Kvco}{2 \cdot N \cdot C},$$

which is a constant. This means that the frequency correction by the loop is linearly proportional to the phase error in a conventional charge pump-based PLL. For a bang-bang operation, the frequency correction is not linearly proportional to the phase error because the frequency correction is constant for arbitrary phase error and the coefficient depends on the phase error, which is $$\frac{\Delta f}{2\pi \cdot \Delta te \cdot N},$$

where Δf is the frequency step size of the bang-bang operation and Δte is the timing error seen by the PFD. This means that the frequency gain goes to infinity when the phase error approaches zero. Comparing the two coefficients, the effective capacitance C in the digital integral path is $$Ceff = \frac{\Delta te \cdot Tch \cdot Kvco}{\Delta f}.$$

In a conventional fractional-N PLL with a high order multi-bit delta-sigma modulator, Ich is 200 uA and Kvco is 25 MHz/V, the timing error is from −4Tvco to 4Tvco, which is about −1.2 ns to 1.2 ns at 3.6 GHz output. The minimum frequency step Δf is 5 Hz in the design of the invention so that the effective capacitance of the digital loop filter in the proposed architecture compared to the conventional charge pump-based PLL is up to μF order which is 1000 times that of the conventional analog PLL design.

Due to large effective capacitance, the damping factor is large so there is no jitter peaking, which is a type I loop filter characteristic. Moreover, because of the bang-bang operation in the integral path, the static phase error is kept zero like a typical characteristic in a type II loop filter. The loop bandwidth (−3 dB of closed loop transfer function) for the conventional charge pump is:

$$\omega{-3}\ dB=\omega n\{1+2\zeta^2+[(1+2\zeta^2)+1]^{1/2}\}^{1/2} \quad (2),$$

where ωn is the nature frequency and ζ is the damping factor and the relation between ωn and ζ is Kvco·Ich·R/2πN=2ζ·ωn, where Kvco is the effective VCO gain in the analog feed-forward path, Ich is the charge pump current used in the analog feed-forward path and R is resistance in the proportional path. Because the damping factor is large, ζ is infinite to obtain linear approximation, and ω−3 dB=Kvco·Ichp·R/2πN. The loop bandwidth is independent of effective capacitance in the integration path so that the gain variation induced by the bang-bang operation has no influence on the loop bandwidth.

Figure 2:
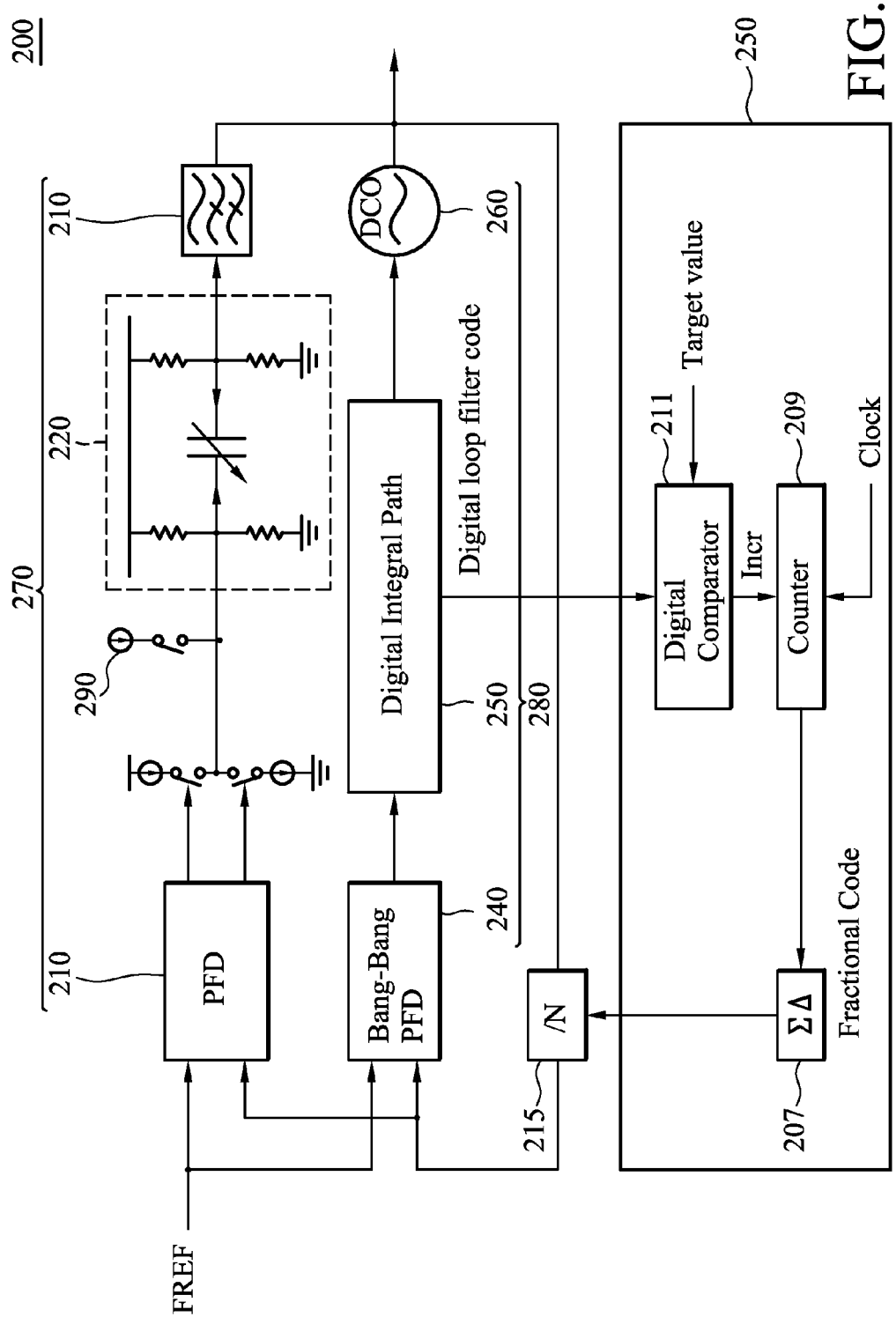
FIG. 2 is a schematic diagram of a phase locked loop (PLL) with a loop bandwidth calibration circuit according to an embodiment of the invention.

FIG. 2 is a schematic diagram of a phase locked loop (PLL) with a loop bandwidth calibration circuit according to an embodiment of the invention. The PLL 200 comprises an analog phase correction path 270 and a digital frequency correction path 280. The analog phase correction path 270 comprises a conventional phase frequency detector (PFD) 210 and a linear phase correction unit (LPCU) 220, which is coupled to a digital controlled oscillator (DCO) output by a high pass filter 230. Preferably, the high pass filter 230 is an AC coupling capacitor. The LPCU 220 corrects phase in a time domain generated by a conventional PFD 210 and thus avoids all the noise and spur induced by a time to digital converter (TDC) and a DCO 260. Specifically, the DCO 260 can be a ring oscillator or an LC oscillator. The digital frequency correction path comprises a bang-bang PFD 240, a digital integral path circuit 250 coupled to the bang-bang PFD 240, and a DCO 260 coupled to the digital integral path circuit 250. In the digital frequency correction path 280, frequency of the reference clock FREF is sampled by the bang-bang PFD 240 and integrated in a digital capacitor. The LPCU 220 and the bang-bang PFD 240 eliminates the need for a TDC used in a conventional all digital phase locked loop (ADPLL) to reduce transient and switching noise.

A detailed circuit diagram of the LPCU 220 is also shown in FIG. 2. A common mode of the LPCU is biased at VDD/2 by a resistive voltage divider to provide good power to signal rejection ratio (PSRR). A current driver is used instead of a voltage driver to obtain higher gain with good PSRR and a low pass filter (LPF) is added to filter out transient ripple. The circuits can use a thin oxide device to take advantage of the advanced process technology because it has immunity to thin gate oxide leakage.

Furthermore, the PLL further comprises a calibration current source 290 and a loop bandwidth calibration circuit 205. The calibration current source 290 is coupled to the LPCU 220 via a switch. The loop bandwidth calibration circuit 205 is coupled to the digital integral path circuit 250. More specifically, the loop bandwidth calibration circuit 205 comprises a sigma-delta modulator coupled to the frequency divider 215, a counter 209 coupled to the sigma-delta modulator 207, and a comparator 211 coupled to the counter 209. Before calibration, the calibration current source 290 injects a calibration current into the LPCU 220 and a target value is obtained. The loop bandwidth calibration circuit 205 operates after the calibration current source stops injecting the calibration current into the LPCU 220.

The calibration current as shown on FIG. 2, which is mirrored from the charge pump current with a ratio β, is injected into a resistor. The VCO gain in the analog feed-forward path is Δf/(βIchp*R), and the −3 dB frequency is:

$$\omega{-3}\ dB=\Delta f/\beta \cdot 2\pi N \quad (3),$$

where Δ f is the frequency variation when the current is injected into the resistor. As shown in (3), the −3 dB frequency only depends on Δ f, because β is determined by the device to achieve higher resolution than that of an open loop operation as shown in FIG. 2.

When the calibration current is injected into a resistor, the capacitance variation of the varactor induced by voltage offset β*Ichp*R in the proportional path, introduces a frequency offset. The digital loop filter reacts to the frequency offset in the digital integral path to compensate for the intentionally injected frequency error. The digital code in the digital loop filter is loaded to flip-flops as the target value. Then, the calibration current is turned off and the fractional code of the divider is increased depending on the output of the digital comparator which compares the digital code and the target value and outputs a flag indicating whether the digital code reached the target value or not.

The calibration loop reads the flag to adjust fractional code of the PLL until the flag indicates that the digital code is equal to the target value. Since the fractional code represents the frequency variation Δ f, the loop bandwidth is obtained according to (3).

The measured fractional code of the divider is 39/2048 when the code of the digital loop filter is equal to the target value and the input frequency is 26 MHz, so the frequency offset Δf induced by the voltage offset β*Ichp*R is equal to 26 MHz multiplied by 39/2048.

Figure 3:
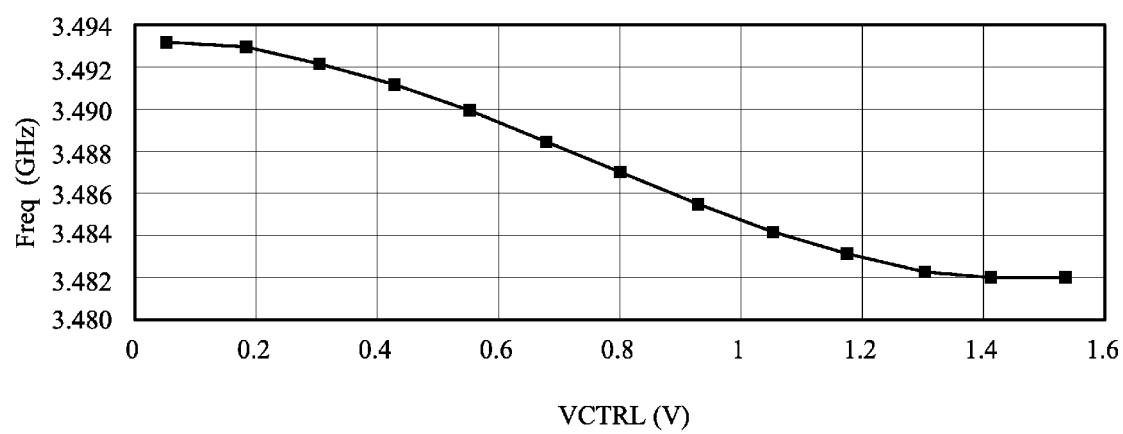
FIG. 3 is a schematic diagram showing a measured DCO gain by a spectrum analyzer.
Figure 4:
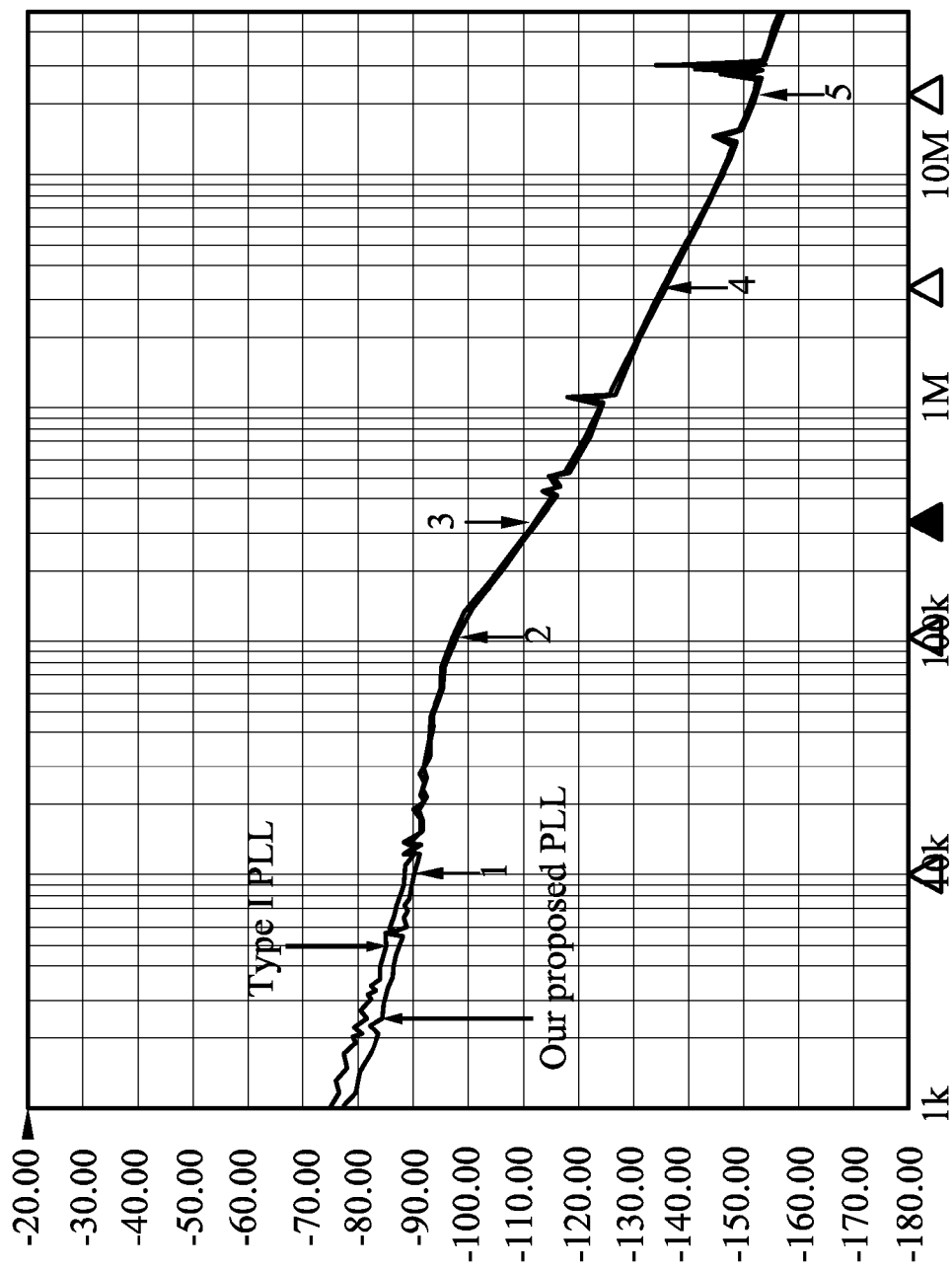
FIG. 4 is a schematic diagram showing comparison of the measured phase between a conventional type-I PLL and a phase locked loop (PLL) with a loop bandwidth calibration circuit according to an embodiment of the invention.

According to (3), the loop bandwidth is equal to 96 KHz, because Δf is 495.12 KHz , β is 1/168 and N is 138. The calculated DCO gain Δf/(β*Ichp*R) in the proportional path is 11.90 MHz/V. A spectrum analyzer was used to measure the DCO gain to verify the calibrated value. FIG. 3 shows that DCO gain was 11.88 MHz/V. The agreement between the measured and calibrated value validates the proposed technique. FIG. 4 shows that the measured phase noise was the same as that of a PLL with type I loop filter which has lower jitter peaking. The static phase error is kept zero because the measured output of the bang-bang PFD showed that the possibility of the phase lead/lag is the same.

Figure 5:
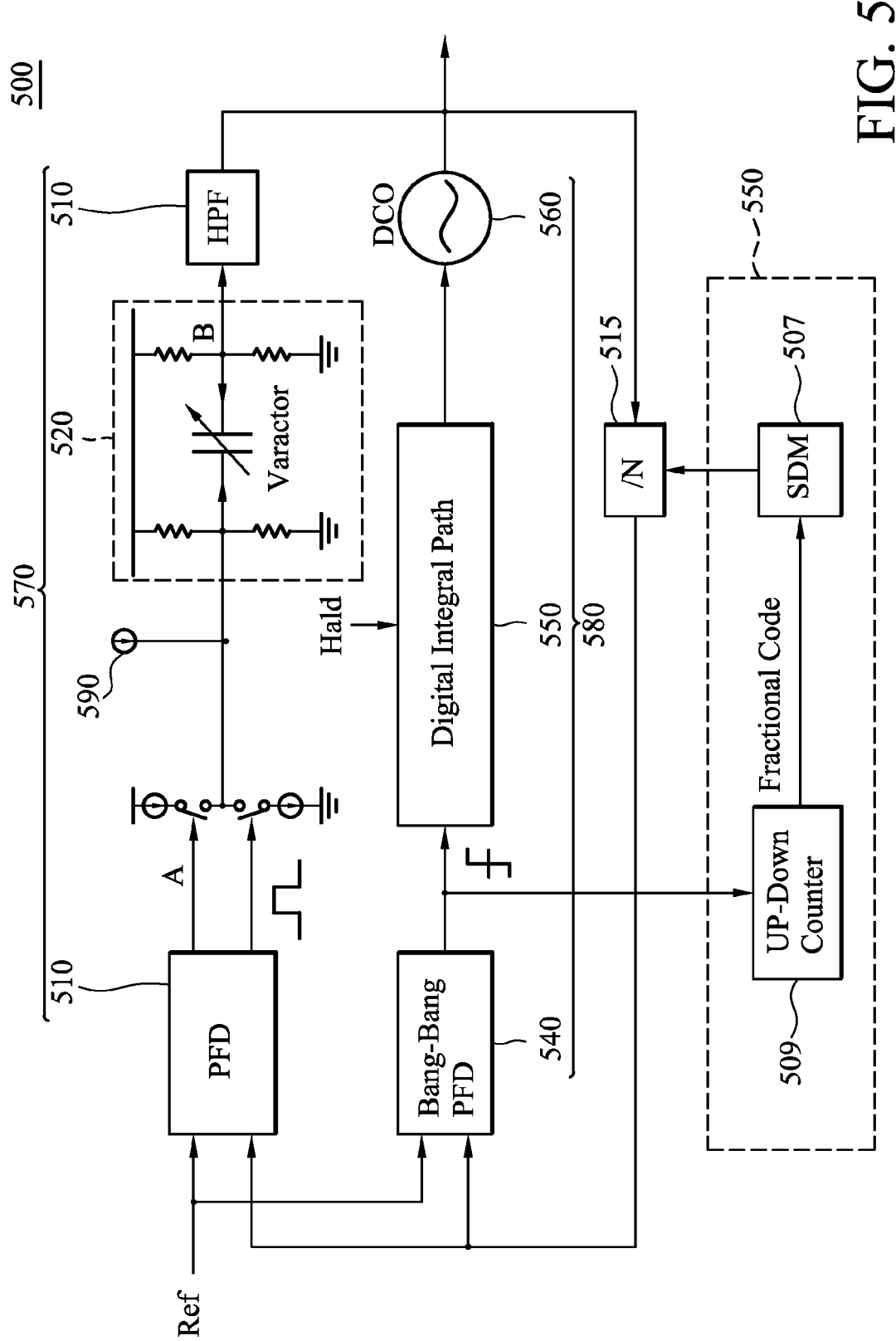
FIG. 5 is a schematic diagram of a phase locked loop (PLL) with a loop bandwidth calibration circuit according to another embodiment of the invention.

FIG. 5 is a schematic diagram of a phase locked loop (PLL) with a loop bandwidth calibration circuit according to another embodiment of the invention. The PLL 500 comprises an analog phase correction path 570, a digital frequency correction path 580, a calibration current source 590, and a loop bandwidth calibration circuit 505. The analog phase correction path 570 comprises a linear phase correction unit (LPCU) 520. The digital frequency correction path 580 comprises a digital integral path circuit 550. The calibration current source 590 is coupled to the LPCU 520. The loop bandwidth calibration circuit 505 is coupled to a frequency divider 515 and coupled between the input and output of the PLL 500. More specifically, the loop bandwidth calibration circuit 505 comprises a sigma-delta modulator 507 coupled to the frequency divider 515 and an Up-Down counter 509 coupled to the sigma delta modulator 507. The Up-Down counter 509 is also coupled to an input of the digital integral path circuit 550 such that a calibration loop is formed during operation of the loop bandwidth calibration circuit. During the calibration mode, a precise calibration current, mirrored from a band-gap reference with a ratio α is injected into the proportional path. The digital integral path is held constant to retain a desired channel output of the PLL. This causes the bang-bang PFD to generate a phase lag signal. The calibration loop reads the output from the bang-bang PFD and adjusts the PLL fractional code until the bang-bang PFD indicates the possibility of a simultaneous phase lag and lead.

The invention provides a loop bandwidth calibration technique for a DCO-based fractional-N PLL. The PLL has a linear PFD in a proportional path and a bang-bang PFD in an integral path. Calibrations work in pure digital domain and 1 KHz resolution is achieved by the closed loop operation. Analysis showed that the architecture had both advantages of a type I and a type II loop filter such as low jitter peaking and zero static phase error. Measurements taken validated the effectiveness of the disclosed technique.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A phase locked loop (PLL) with a loop bandwidth calibration circuit, comprising:
    an analog phase correction path comprising a linear phase correction unit (LPCU) coupled between an input and output of the PLL;
    a digital frequency correction path comprising a digital integral path circuit coupled between the input and output of the PLL;
    a calibration current source coupled to the LPCU; and
    a loop bandwidth calibration circuit coupled to a frequency divider coupled between the input and output of the PLL;
wherein the loop bandwidth calibration circuit operates after the calibration current source injects a calibration current into the LPCU.

2. The PLL as claimed in claim 1, wherein the loop bandwidth calibration circuit comprises a sigma-delta modulator coupled to the frequency divider, a counter coupled to the sigma-delta modulator, and a comparator coupled to the counter.

3. The PLL as claimed in claim 2, wherein the comparator is also coupled to the digital integral path circuit such that a calibration loop is formed during operation of the loop bandwidth calibration circuit.

4. The PLL as claimed in claim 1, wherein the loop bandwidth calibration circuit comprises a sigma-delta modulator coupled to the frequency divider and an Up-Down counter coupled to the sigma-delta modulator.

5. The PLL as claimed in claim 4, wherein the Up-Down counter is also coupled to an input of the digital integral path circuit such that a calibration loop is formed during operation of the loop bandwidth calibration circuit.

6. The PLL as claimed in claim 1, wherein the analog phase correction path further comprises a high pass filter coupled between the LPCU and the output of the PLL.

7. The PLL as claimed in claim 6, wherein the analog phase correction path further comprises a phase frequency detector coupled between the LPCU and the input of the PLL.

8. The PLL as claimed in claim 1, wherein the LPCU comprises a varactor coupled between the input and output of the PLL.

9. The PLL as claimed in claim 1, wherein the digital frequency correction path further comprises a digital controlled oscillator coupled between the digital integral path circuit and the output of the PLL.

10. The PLL as claimed in claim 9, wherein the digital frequency correction path further comprises a bang-bang phase frequency detector coupled between the digital integral path circuit and the input of the PLL.

11. A phase locked loop (PLL) with a loop bandwidth calibration circuit, comprising:
    an phase correction path comprising a linear phase correction unit (LPCU) coupled between an input and output of the PLL;
    a frequency correction path comprising a integral path circuit coupled between the input and output of the PLL;
    a calibration current source coupled to the LPCU; and
    a loop bandwidth calibration circuit coupled to a frequency divider coupled between the input and output of the PLL;
wherein the loop bandwidth calibration circuit operates after the calibration current source injects a calibration current into the LPCU.

12. The PLL as claimed in claim 11, wherein the loop bandwidth calibration circuit comprises a sigma-delta modulator coupled to the frequency divider, a counter coupled to the sigma-delta modulator, and a comparator coupled to the counter.

13. The PLL as claimed in claim 12, wherein the comparator is also coupled to the integral path circuit such that a calibration loop is formed during operation of the loop bandwidth calibration circuit.

14. The PLL as claimed in claim 11, wherein the loop bandwidth calibration circuit comprises a sigma-delta modulator coupled to the frequency divider and an Up-Down counter coupled to the sigma-delta modulator.

15. The PLL as claimed in claim 14, wherein the Up-Down counter is also coupled to an input of the integral path circuit such that a calibration loop is formed during operation of the loop bandwidth calibration circuit.

16. The PLL as claimed in claim 11, wherein the phase correction path further comprises a high pass filter coupled between the LPCU and the output of the PLL.

17. The PLL as claimed in claim 16, wherein the phase correction path further comprises a phase frequency detector coupled between the LPCU and the input of the PLL.

18. The PLL as claimed in claim 11, wherein the LPCU comprises a varactor coupled between the input and output of the PLL.

19. The PLL as claimed in claim 11, wherein the frequency correction path further comprises a controlled oscillator coupled between the integral path circuit and the output of the PLL.

20. The PLL as claimed in claim 19, wherein the frequency correction path further comprises a bang-bang phase frequency detector coupled between the integral path circuit and the input of the PLL.

* * * * *